US006643601B1

(12) United States Patent
Struck et al.

(10) Patent No.: US 6,643,601 B1
(45) Date of Patent: *Nov. 4, 2003

(54) APPARATUS AND METHOD FOR TESTING SNOW REMOVAL EQUIPMENT

(75) Inventors: John M. Struck, Iron Ridge, WI (US); Terry Wendorff, Cedarburg, WI (US)

(73) Assignee: Sno-Way International, Inc., Hartford, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/080,840

(22) Filed: Feb. 22, 2002

Related U.S. Application Data

(63) Continuation of application No. 09/597,103, filed on Jun. 20, 2000, now Pat. No. 6,351,722, which is a continuation of application No. 09/236,798, filed on Jan. 25, 1999, now Pat. No. 6,081,770, which is a continuation of application No. 08/832,914, filed on Apr. 4, 1997, now Pat. No. 5,864,783.

(51) Int. Cl.[7] .............................. G07C 5/00; G07C 5/08
(52) U.S. Cl. ......................... 702/114; 702/184; 701/1; 701/29; 340/901
(58) Field of Search ............................. 702/184, 114, 702/182, 183, 187; 701/1, 29, 30, 35, 50; 340/438, 901

(56) References Cited

U.S. PATENT DOCUMENTS

| 4,193,025 A | * | 3/1980 | Frailing et al. ............. 320/136 |
|---|---|---|---|
| 4,831,560 A | | 5/1989 | Zaleski |
| 4,831,569 A | * | 5/1989 | Duriez ........................ 708/136 |
| 4,898,333 A | * | 2/1990 | Kime et al. ................. 180/53.4 |
| 5,151,647 A | * | 9/1992 | Frantz ........................... 322/11 |
| 5,453,939 A | * | 9/1995 | Hoffman et al. ............. 340/438 |
| 5,463,567 A | * | 10/1995 | Boen et al. ..................... 701/33 |
| 5,524,368 A | * | 6/1996 | Struck et al. ................ 180/167 |
| 5,530,360 A | * | 6/1996 | Kerchaert et al. ........... 324/379 |
| 5,541,840 A | * | 7/1996 | Gurne et al. ................... 701/33 |
| 5,561,610 A | * | 10/1996 | Schricker et al. ....... 364/551.01 |
| 5,657,224 A | * | 8/1997 | Lonn et al. .................. 345/700 |
| 5,659,470 A | * | 8/1997 | Goska et al. ................. 177/141 |
| 5,864,783 A | * | 1/1999 | Struck et al. ................ 340/901 |
| 6,081,770 A | * | 6/2000 | Struck et al. ................ 340/901 |
| 6,154,122 A | * | 11/2000 | Menze ..................... 340/425.5 |
| 6,323,759 B1 | * | 11/2001 | Menze ..................... 340/425.5 |
| 6,351,722 B1 | * | 2/2002 | Struck et al. ................ 340/901 |

* cited by examiner

*Primary Examiner*—Patrick Assouad
(74) *Attorney, Agent, or Firm*—Reinhart Boerner Van Deuren S.C.

(57) ABSTRACT

An apparatus and method for analyzing and diagnosing the operational condition and malfunctions of snow removal equipment. A diagnostic interfaces coupled to snow removal equipment and to an analysis retrieves and analyzes data and compares the data to a set of reference data. The apparatus and method can further comprise a display module for displaying detailed information relating to the operational status of the snow removal equipment. Alternative embodiments of the present invention are mobile or facilitate servicing networks.

15 Claims, 2 Drawing Sheets

APPARATUS AND METHOD FOR TESTING SNOW REMOVAL EQUIPMENT

This application is a continuation of application Ser. No. 09/597,103, which was filed on Jun. 20, 2000, now U.S. Pat. No. 6,351,722 which is a continuation of application Ser. No. 09/236,798, which was filed on Jan. 25, 1999 and which is now U.S. Pat. No. 6,081,770, which is a continuation of application Ser. No. 08/832,914, which was filed on Apr. 4, 1997 and which is now U.S. Pat. No. 5,864,783.

BACKGROUND OF THE INVENTION

The present invention relates generally to an apparatus and method for testing the operational status of snow removal equipment and providing information concerning the repair processes of such equipment. More particularly, the present invention relates to testing and correcting problems with the electronic, electrical, hydraulic and other systems of such snow removal equipment.

In snowstorms and during heavy snow falls, snow removal equipment is used to maintain clear and safe roads for travel. Others use snow removal equipment to clear parking lots and driveways or simply to get themselves to their destinations. The speed with which snow removal equipment problems can be identified and corrected during snow emergency situations is therefore critical. Snow removal equipment has become more sophisticated, and accordingly, more complex. When snow removal equipment is inoperable, the complexity of the machinery typically requires time-consuming examination of the numerous components and systems of each piece of equipment to determine the cause of the problem. The importance of efficiently and reliably restoring inoperable snow removal equipment to an operational state is particularly appreciated by those who make a living servicing highways, roads and driveways in inclement weather and also by those who are responsible for the safety of people traveling in severe conditions.

In the past, each component and system of snow removal equipment had to be individually tested through an extensive series of diagnostic procedures—each of which focused on only a single component or system. This time-consuming analysis is subject to error and expensive. After problems were identified under this diagnosis method, procedures had to be established and steps implemented for correcting any problems. Further, this diagnostic and repair process often required obtaining repair manuals for the numerous and diverse types of snow removal equipment available. In additional to not being readily available, manuals often require updating which can be an awkward, imprecise and costly process.

Under this past testing method and procedure, the snow removal equipment had to be brought to a site properly equipped with the machinery and tools for conducting such testing. This is problematic in that the malfunctioning snow removal equipment in need of service was not, in some situations, mobile. Under such circumstances, the snow removal equipment would generally have to be towed to the repair facility.

Snow removal equipment is sometimes modified after the initial purchase. Service technicians often have difficulty fixing malfunctioning snow removal equipment if the modifications are unfamiliar to the service technician and not included in manuals. Furthermore, various types of snow removal equipment can be operated concurrently, e.g., a plow is commonly used in front of a truck while a salt spreader distributes salt behind the truck. If one type of snow removal equipment is malfunctioning, the effectiveness of snow removal efforts are greatly impaired. The various types of snow removal equipment typically require various manuals and diagnostic procedures.

It is therefore an object of the present invention to provide an improved apparatus and method for assessing and analyzing the operational status of snow removal equipment.

It is a further object of the present invention to provide an improved apparatus and method to maximize the time snow removal equipment is operational.

It is another object of the present invention to provide a more reliable apparatus and method for determining the operational status of snow removal equipment and associated vehicles.

It is a still further object of the present invention to provide a more comprehensive analysis apparatus and method for determining the operational status of snow removal equipment while simultaneously utilizing fewer resources than prior art methods.

It is a further object of the present invention to locate a source of malfunction in snow removal equipment and to restore the equipment to an operable condition quickly and reliably.

It is a still further object of the present invention to maintain usable data concerning a variety of snow removal equipment components and systems, including service records pertaining to particular pieces of snow removal equipment.

It is a still further object of the present invention to store and provide data facilitating the diagnosis and repair of snow removal equipment.

It is yet another object of the present invention to display data concerning the operational status of snow removal equipment.

It is a still further object of the present invention to provide an improved method and apparatus which allow users to obtain data acquired and maintained by others.

BRIEF DESCRIPTION OF THE DRAWINGS

The features of the present invention that are believed to be novel are set forth with particularity in the appended claims. The invention, together with the further objects and advantages thereof, may best be understood by reference to the following description taken in conjunction with the accompanying drawings, wherein like reference numerals identify like elements, and wherein:

DETAILED DESCRIPTION OF THE PREFERRED EMBODIMENT

Figure 1:
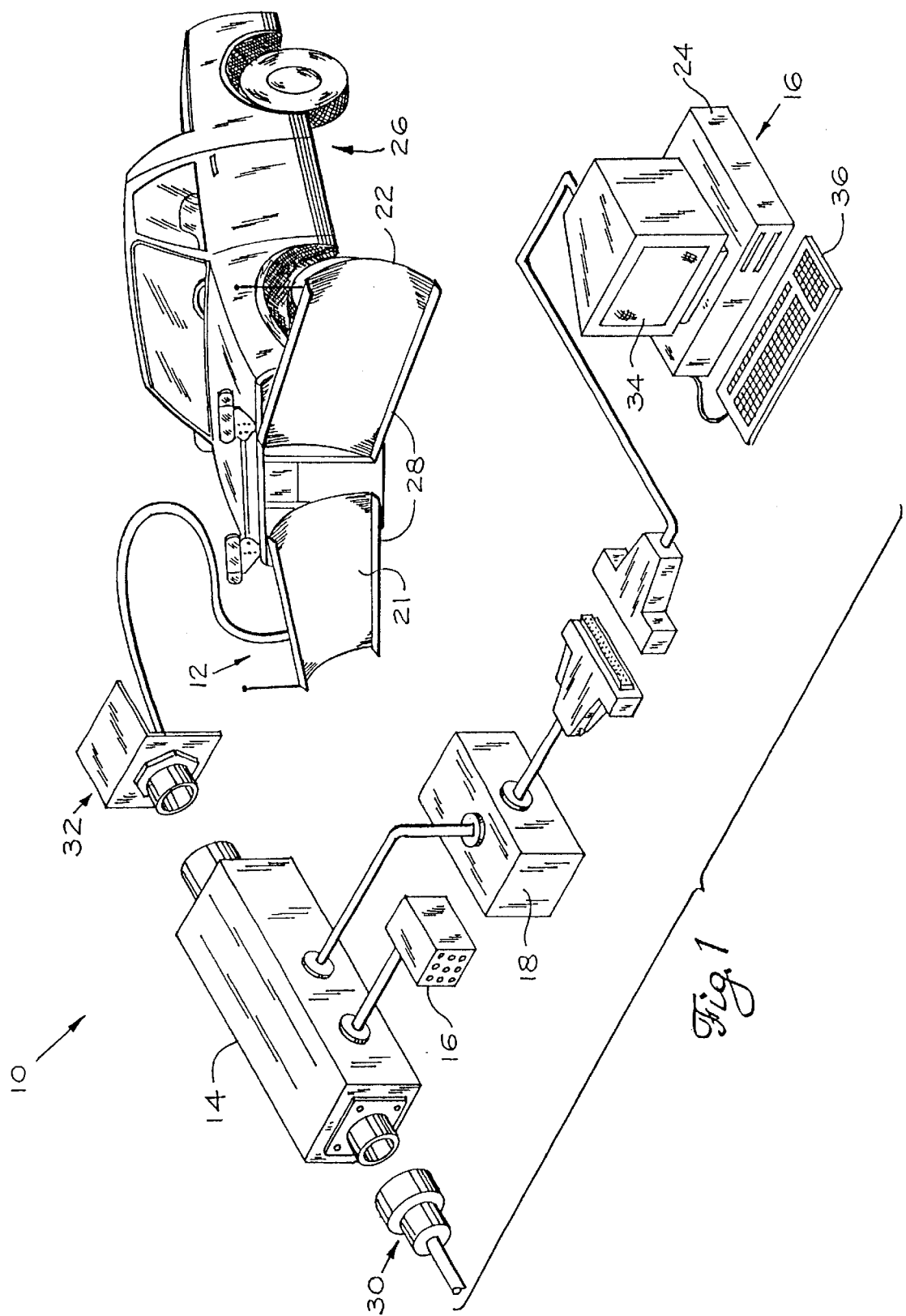
FIG. 1 illustrates a diagnostic system constructed in accordance with one preferred embodiment of the invention.
Figure 2:
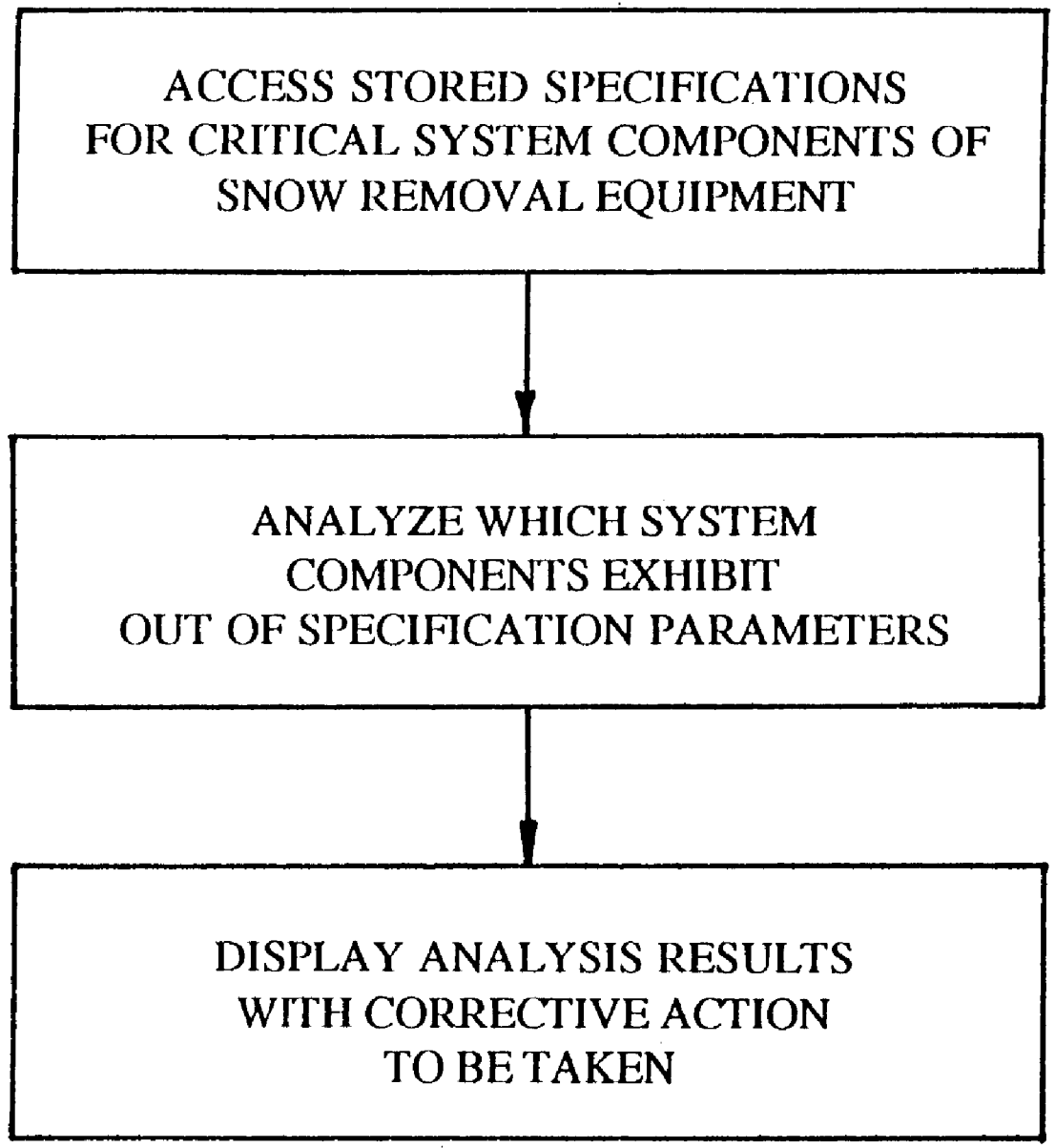
FIG. 2 depicts a block diagram of a method implemented by computer hardware and software and useful with some preferred embodiments of the invention.

Referring to the figures and more particularly to FIG. 1, a diagnostic system constructed in accordance with one form of the present invention is illustrated at 10. The diagnostic system 10 preferably comprises at least one diagnostic interface 14 that can be coupled to snow removal equipment 12. When used herein, "snow removal equipment" shall include snow plows, snow blowers, salt spreaders, rotary brushes and the other equipment used to remove snow. The diagnostic interface 14 can perform a variety of functions and preferably includes an analysis module 16 to receive data from the snow removal equipment 12. The data received by the analysis module 16 preferably includes data relating to at least one of the electronic, electrical and hydraulic systems of the snow removal equipment 12.

The present invention can systematically locate the source and cause of a malfunction in snow removal equipment 12 using a single apparatus and method instead of requiring that a separate and distinct examination and diagnosis be conducted of all of the components and systems of the snow removal equipment 12. The present invention can provide specific information to a service technician for resolving malfunctions or other problems by analyzing the snow removal equipment 12 electrically, electronically and hydraulically. The present invention further provides the service technician with information concerning the specific action and associated steps necessary to correct the problem and to restore the snow removal equipment 12 to an operational state. The present invention also provides the customer with the peace of mind that when servicing is required, the customer's snow removal equipment 12 will receive the most cost effective and efficient service possible. In addition to providing peace of mind, the present invention reduces warranty costs, minimizes snow removal equipment 12 down time and reduces operating costs.

In accordance with one preferred embodiment of the present invention, the diagnostic system 10 further includes a data acquisition module 18 which provides analog data to the analysis module 16. The data acquisition module 18 preferably provides real time data indicating the condition of the snow removal equipment 12. Preferably, one or more diagnostic interfaces 14 connect between the snow removal equipment 12 and the data acquisition module 18 to perform the actual diagnostic functions.

The present invention can analyze the complete electronic, electrical and hydraulic systems on the snow removal equipment 12. The diagnostic interface 14 supplies data relating to the electrical, electronic, and hydraulic systems and components on the snow removal equipment 12 and its performance. This data, as it is supplied by the diagnostic interface 14 to the data acquisition module 18 where it is available to the service technician preferably provides detailed information on voltage, amperage, continuity, resistance, hydraulic pressures and other desired parameters.

A snow removal equipment 12 diagnostic interface 14 can obtain values from the snow removal equipment 12, including, but not limited to, direct current, motor resistance, voltage and amperage, right and left angle solenoid resistance, voltage and amperage, lift solenoid resistance, voltage and amperage, down pressure system solenoid resistance, voltage and amperage, down pressure system pressure switch resistance, voltage and amperage, and wiring and connector continuity and resistance. The snow removal equipment 12 diagnostic interface 14 can also monitor the right angle system, the left angle system, and the down pressure system hydraulic relief settings, debris or leakage in the system and pressure switch settings on snow removal equipment 12, such as snow plows 22 which include these more sophisticated system components. One preferred embodiment of the present invention has a snow removal equipment interface 30 which can be coupled to the snow removal equipment 12 and more quickly attaches and detaches the diagnostic interface 14 to the snow removal equipment 12 for use.

The analysis module 16 uses software to process the analog data and convert it to readily understandable feedback. The feedback can take a variety of forms and provides the service technician with hard data on components or systems which are within specification or out of specification. This assessment can be compared to reference data and specifications stored within the diagnostic system 10. The present invention can be programmed to flag data when the data obtained from the snow removal equipment 12 through the diagnostic system 10 differs by a specified amount or more from a set of reference data. One preferred embodiment of the present invention can communicate to the service technician the appropriate actions and steps necessary to bring the subject snow removal equipment 12 back within specification. The software is preferably upgradable as the snow removal equipment 12 is improved and new products and/or features are added.

The analysis module 16 preferably comprises a standard personal computer 24 with a video display terminal 34. The personal computer 24 provides a familiar and simple interface with the present invention. The dealer or service technician conducting the diagnostic analysis can use an existing computer 24 or a separate stand-alone unit. The dealer or service technician can also set up a remote station using a video display terminal 34, keyboard and switch box, which is connected to their stand-alone unit. A notebook personal computer 24, alternatively, can be used in conjunction with a diagnostic system 10 and is particularly well-suited to be used with the embodiment of the present invention described herein as a mobile diagnostic system 10.

One preferred embodiment of the present invention can conduct a complete diagnostic analysis either in a static or dynamic (working) mode. Some systems of the snow removal equipment 12 can most effectively be tested in the dynamic mode because it is sometimes necessary, as with some hydraulic systems of the snow removal equipment 12, to test changes in parameters during different stages of operation.

One preferred embodiment of the present invention is small enough to be mobile and, thereby, provides improved diagnostic and corrective service assistance even when the problematic snow removal equipment 12 and an. associated vehicle 26 cannot be transported to a service facility for repairs. An advantage of this embodiment is that both valuable time and money required for towing such an inoperable vehicle 26 and associated snow removal equipment 12 to a service facility is spared. Further, the compact and integral nature of the diagnostic system 10 of this embodiment of the present invention makes the system 10 easy to transport and assemble further enhancing the efficiency of the service technician.

Another alternative embodiment of the present invention includes a full capability diagnostic system 10 for use at a primary servicing facility able to operate in conjunction with one or more reduced capability mobile diagnostic systems 10 which are carried on trucks or vehicles used by service technicians. These mobile diagnostic systems 10 can be designed to diagnose and provide solutions to the most common problems and malfunctions experienced by incapacitated or immobile snow removal equipment 12. Alternatively, the mobile diagnostic system 10 may be downloaded with only information and software relevant to the particular piece of snow removal equipment 12 currently being serviced as opposed to being equipped with full-capability diagnostic software and the entire database maintained by the system which can unnecessarily make the diagnostic system 10 more cumbersome. A notebook personal computer 24 is particularly useful for the mobile diagnostic system. Yet another preferred embodiment of the invention includes an on-board diagnostic system 10 which is carried by the snow removal equipment 12 and diagnoses certain malfunctions while the snow removal equipment 12 is underway. This preferred embodiment can alert an operator to the onset of a problem so that corrective action can be taken prior to worsened or major damage occurring.

Preferred embodiments of the present invention also enable the service technician to either establish or retrieve, and then to maintain, a complete service history by customer name, date, phone number, equipment serial number, or other unique identification field. This database feature can save critical time, facilitate both the diagnosis and repair portions of the procedure, and further minimize the resources required for service by informing the technician about prior problems and repairs on a component or system of a particular piece of snow removal equipment 12. Once data are stored regarding a particular piece of snow removal equipment 12, that data can be instantaneously recalled to facilitate subsequent diagnosis and/or repairs.

The database entry for a particular piece of equipment 12 can be initiated either by a dealer at the time of sale or by a service technician at the time the equipment 12 is serviced. Information entered by the dealer can include dealer name, dealer address, dealer phone number, dealer code, service technician's name and any other desired information. If the dealer does not maintain a database with the customer and equipment 12 information, the service technician can initiate a service record within a database for a particular piece of snow removal equipment 12 by entering the customer's name and the customer's snow removal equipment 12 into the database. If the database was initiated and established by the dealer at the sale of the snow removal equipment 12, the service technician can retrieve that data, examine the service history, and further maintain the database with regard to the equipment 12 being serviced. The service technician can enter the service date, customer name, customer address, customer phone number, serial numbers, service technician identification and other desired information.

The usefulness of an embodiment of the present invention which maintains a database of information relating to the snow removal equipment 12 which is serviced is illustrated in the following example. If a snow plow 22 is serviced for a replacement of a wing 21 of the snow plow 22, the repair process will typically address problems which have arisen at the time of repair. Severe damage can affect other operations of the snow plow 22, for example, the numerous electrical connections between and inside various components. However, the damage to the snow plow 22 caused by the initial incident may not manifest itself for a period of time—anywhere from hours to months or years later. A service technician using an embodiment of the diagnostic system 10 equipped for database maintenance can recall the service records through the diagnostic system 10, and is able to see that the wing 21 of the snow plow 22 was replaced from the service history. Using only this information, or this information together with additional information which [is] noted in the database, the service technician is provided with enough information to deduce that the problem may have stemmed from the previous incident. For example, the life of a pressure switch or other component of the snow removal equipment 12 may have been reduced by impact associated with the previous incident. If a number of pressure switches are used in the snow removal equipment 12 and may be causing the problem needing service, the pressure switches located nearest the replaced wing 21 can be checked first. The benefit of this diagnostic system 10 is that the service technician can narrow and define the problem efficiently using complete knowledge.

Information concerning snow removal equipment 12 and its performance and maintenance is of interest to the manufacturers of such snow removal equipment 12 in order to improve on and perfect their products, to snow removal equipment 12 dealers who want to understand and sell their products more effectively, and to the servicers of snow removal equipment 12. The diagnostic system 10 of the present invention accommodates the informational needs of each of these distinct groups by incorporating into one preferred embodiment of the present invention a networking system which is able to operate at a number of levels.

The servicers of a particular piece of snow removal equipment 12 benefit by having information available concerning the prior service performed on that piece of equipment 12. A networked servicer database available to the servicer of a particular piece of snow removal equipment 12 permits different service technicians using different diagnostic systems 10 to have information concerning the history of the snow removal equipment 12 available immediately without having to access another diagnostic system 10, search through paper documentation or seek out the service technician who rendered the prior diagnosis and/or repair on a particular piece of snow removal equipment 12. An even further developed embodiment of the present invention can provide a centralized database at a main servicing facility which is accessible by numerous service technicians who are working off-site. Communications between off-site service technicians and service facilities can be achieved by conventional remote communication techniques.

Other entities with an interest in the performance, service and maintenance requirements include the dealers and manufacturers of snow removal equipment 12. Either a dealer or manufacturer of snow removal equipment 12 can maintain a database concerning snow removal equipment 12 in much the same manner as a service facility. However, in maintaining an updated and working database, the dealers and manufacturers will likely want to cooperate with the servicers of such equipment 12 because the servicers likely have the most comprehensive and updated information.

The present invention can be used to create and maintain a single comprehensive database system available to the manufacturers, dealers, and servicers of snow removal equipment 12. This method of using the diagnostic system 10 requires that one of the parties participating in the database system maintains a database to which all three parties contribute data and information. For example, a manufacturer can maintain a database containing files for all snow removal equipment 12, including their service and repair history, to which dealers and servicing facilities can regularly send information to be uploaded. In return, the manufacturer responsible for maintaining the database can provide the dealers and serving facilities with updates to ensure that their own databases are current. A further advantage of such a system is that software and upgrades for the diagnostic system 10 can easily be distributed as the present invention is further developed and as those developments are perfected. This preferred embodiment of the present invention also provides the manufacturer with sufficient data to spot component failure trends, system defects and the like.

Another use of the present invention includes a dynamic service link which allows a service technician to obtain immediate service and repair support from a manufacturer. This diagnostic system 10 allows the service technician to upload data obtained from the snow removal equipment 12 being serviced directly to the primary diagnostic system 10 maintained at the main servicing facility or service support site. If the service technician is using an on-board diagnostic system 10 and is on the road, conventional remote communications can again be used to transfer the relevant information to the support service. The support service herein described can be provided as part of a service package or can be offered for an additional charge by a snow removal equipment manufacturer, dealer, or even a service facility working in conjunction with other snow removal equipment service facilities or independent service technicians.

An alternative embodiment of the present invention accommodates a diagnosis of the more conventional components and systems of an attached vehicle 26 to confirm that the vehicle 26, particularly the vehicle 26 systems which are crucial to the operation of the associated snow removal equipment 12, are in an operational condition. This embodiment performs in substantially the same manner as the present invention performs with regard to the snow removal equipment 12. Such an embodiment can have either a diagnostic interface 14 specially designed to be attached to the snow removal equipment 12 or, alternatively, the diagnostic interface 14 used on the snow removal equipment 12 can be coupled to the vehicle 26 for conducting the diagnosis. Further, the diagnostic interface 14 performs a variety of functions and, preferably, the analysis module 16 receives data from the vehicle 26 as well as the snow removal equipment 12. The analysis module 16 conducts a comparative analysis of the vehicle 26 output or performance against the data contained in the reference set of data as related to the vehicle 26.

Yet another alternative embodiment of the present invention comprises an overload indicator 36 which interfaces with the diagnostic system 10 and is carried either by the vehicle 26 and coupled to the snow removal equipment 12 or carried on the snow removal equipment 12. The overload indicator 36 allows the manufacturer, dealer or service technician to determine if the snow removal equipment 12 has been either abused or used beyond its design capabilities. Occasionally, operators negligently run snow removal equipment 12 into massive or immobile objects such as posts, vehicles or other obstructions while attempting to clear snow. On occasions when the abuse breaks or seriously weakens the snow removal equipment 12, service technicians often have difficulty determining whether the snow removal equipment 12 malfunction stems from an equipment defect or whether the snow removal equipment 12 has been misused.

Warranty costs are sometimes inappropriately born by companies when the cause of a malfunction is unclear. When there is doubt as to whether a warranty covers a particular situation, customer service oriented companies tend to cover damage under warranty in an effort to maintain good customer relations. Therefore, accurately determining whether the snow removal equipment 12 is defective or whether it has been misused can significantly reduce warranty costs.

Preferred embodiments of the overload indicator 36 of the present invention further comprise a tamper resistant design which permits only service technicians and other authorized persons to reset and adjust the settings. This tamper resistant feature prevents snow removal equipment operators from resetting the overload indicator 36 and associated gauges or other mechanisms in an effort to disguise or conceal data or readings which would otherwise indicate that the snow removal equipment 12 has been abused. Traditional techniques can be incorporated into the design such as numeric coding, lock and key functions, or electronic or magnetic passcards.

The overload indicator 36 is preferably designed to monitor load and impact in particular, but preferably also measures additional parameters such as operational time. One preferred method of monitoring loading records the pressure levels of the hydraulic systems of the snow removal equipment 12. Impact is measurable by recording the force imposed on the hydraulic systems over time. Additional measuring and recordation methods can also be used.

When data are downloaded from the overload indicator 36 located on the vehicle 26 or snow removal equipment 12 to the diagnostic system 10, the service technician can ascertain whether the snow removal equipment 12 was misused if the readings from the overload indicator 36 exceed the design capabilities of the snow removal equipment 12 specified by the manufacturer. The overload indicator 36 can communicate overload conditions to the service technician through numerical or character data, sound or visually indicator mechanism. The overload indicator 36 can be coupled to the diagnostic system 10 during service repairs or routine maintenance to inform the service technician of damage to the snow removal equipment 12. Preferred embodiments of the present invention incorporate wireless remote technology, such as is disclosed in U.S. Pat. No. 5,524,368 for a "Wireless Snow Plow Control System," to receive signals from the overload indicator 36. Usage data, including the number of operational hours and impact and load data, can all be downloaded to the diagnostic system 10. Diagnostic systems 10 including data storage capabilities such as those described hereinabove can store the usage data for future reference. This feature is particularly advantageous when operator abuse weakens one or more components of the snow removal equipment 12, but physical manifestations of this weakened condition do not arise until a later time.

The overload indicator 36 in one preferred embodiment of the present invention is coupled to the hydraulic systems of the snow removal equipment 12 directly or using a hydraulic line. Additionally, a gauge 38 or series of conventional memory-equipped gauges 38 are affixed to the snow removal equipment 12 to measure and record load and impact data concerning a particular piece of snow removal equipment 12. Electrical or mechanical gauges 38 further equipped with a peak pressure indicator record maximum loads, impacts and additional data associated with the snow equipment removal equipment 12 and its operations. The overload indicator 36 of preferred embodiments of the present invention further comprises a timing device having an inertial switch which triggers at threshold loads. An additional gauge 38 comprising an accelerometer for determining and recording impacts related to the snow removal equipment 12 provides additional data on preferred embodiments of the present invention. Alternative embodiments of the overload indicator 36 of the present invention incorporate conventional electrical, mechanical or electromechanical measuring machinery.

The increased complexity and improved performance of snow removal equipment 12 necessitates more sophisticated and efficient diagnostic and repair systems and methods. One particular configuration of the snow plow 22, described herein for illustrative purposes, comprises independently controlled multi-position left and right wings 21 which provide for motion upwards and downwards, angled, and forward and backward. In addition, this particular snow plow 22 design incorporates a down pressure system, highstacking, full trip action, steel components, and can accommodate ½, ¾ and 1 ton trucks. Numerous standard and optional features contained on snow plows 22, such as headlights and traits which make assembly and affixing the system 10 on a truck easier, also can be tested by preferred embodiments of the present invention.

One standard characteristic present on most snow plows 22 is the hydraulically activated raise and lower feature controlling a plow blade 28 which allows the plow blade 28 to be lowered into position for moving snow or raised for carrying off of the ground when the snow plow 22 is not in use. This same raising and lowering action is required for the operation of other types of snow removal equipment 12 as well, e.g., rotary brushes. As an illustrative example, the method and procedure for using the present invention to diagnose both a single component and a hydraulic system contained in the above-described snow plow 22 will be described. Of course, one ordinarily skilled in the art can practice the present invention for diagnosing and correcting nearly any problem or malfunction involving snow removal equipment 12, and this explanation is not intended to be limiting.

Some of the more advanced snow plows 22 have a down pressure system which allows the plow blade 28 to better apply pressure to the ground to more effectively clear snow from the vicinity in front of the plow 22. Of course, if the pressure applied by the plow blade 28 to the ground is insufficient, the snow will simply be moved under, and possibly packed beneath, the plow blade 28. This is one example of a situation wherein the present invention can diagnose and provide information about the steps necessary to solve snow plow 22 malfunctions. If the down pressure system of the plow blade 28 function was inoperable, a diagnostic analysis of the system is necessary.

Before focusing on a particular component of snow removal equipment 12, generally a number of fairly simple diagnoses can be conducted any time the present invention is used for testing and correcting problems with snow removal equipment 12. First, the service technician operating the present invention in conjunction with problematic snow removal equipment 12 should personally inspect and verify that the problem exists with the snow removal equipment 12. Next, the diagnostic interface 14 of the present invention is coupled to the snow removal equipment 12. An alternative embodiment further includes a vehicle interface 32 which can be coupled to the vehicle 26 more quickly and easily.

One preferred embodiment of the present invention conducts a short series of preliminary tests immediately to verify the functionality of some of the more rudimentary, but essential, features of the snow removal equipment 12 and/or the necessary functions of the associated vehicle 26. While the exact tests and testing sequence can be adapted to assist a particular user with his or her needs, one preferred embodiment of the present invention immediately commences a diagnostic series on the vehicle 26 battery electrolyte to ensure that it is between 1.222 and 1.254 (75–100%) and tests the terminals to ensure that all electrical connections to the battery are clean, corrosion-free and tight.

The present invention tests the ground by checking that the battery ground to the vehicle 26 from the snow removal equipment 12 is clean, corrosion-free and tight, and that the ground connections for the snow plow 22 wiring harness to the vehicle 26 frame or battery are clean, corrosion-free and tight.

Another of the preliminary tests that can be conducted focuses on the alternator belt to ensure that the belt is in good condition and has the proper belt tension, that the voltage is at a minimum of 13.6 volts with the engine running and with no accessories on, and that a minimum 95 amperage alternator is installed in the vehicle 26.

A further preliminary test that can be conducted to ensure that snow removal equipment 12 is in proper working condition or to diagnose problems in the operability of snow removal equipment 12 is a check of the snow plow 22 wiring harness connectors for corrosion or dirt in and/or on pins and sockets, damaged or missing pins and sockets, and a check that pins are filly engaged in their respective sockets.

Finally, before an exhaustive and all-inclusive series of diagnostic tests is undertaken, fuses and circuit breakers located in the snow removal equipment 12 should be tested. This step of the preliminary test series can also be conducted with respect to the vehicle 26 fused ignition circuit tap. Confirming that the more fundamental functions of the snow removal equipment 12 and associated vehicle 26 are in proper working condition saves time and resources prior to concentrating on the more complicated and difficult components and systems of operation.

Alternative methods of testing problematic and malfunctioning snow removal equipment 12 are available with the diagnostic system 10 of present invention. If the service technician conducting the testing and operating the diagnostic system 10 is able to narrow and define the problem, a well-defined series of tests relating only to a particular component or system can be conducted. If, however, the service technician is unable to locate the particular component or system causing the snow removal equipment 12 to malfunction, a more comprehensive diagnostic procedure can be run on the entirety of the snow removal equipment 12 and/or associated vehicle 26. Of course, the time required for running an entire diagnostic analysis of the snow removal equipment 12 will be greater and can further increase depending on the complexity of the particular type of snow removal equipment 12 being analyzed. However, the present invention enables the entire analysis to be completed far more quickly than prior art methods.

In the event that the plow blade 28 is not properly raising and/or lowering, the diagnostic system 10 can either be permitted to run the entire diagnostic testing sequence, or the service technician can direct the apparatus to run a diagnostic series on only the particular malfunctioning component of the snow removal equipment 12.

Another method of using the present invention conducts a series of checks on similar components of the snow removal equipment 12. For example, depending on the particular brand and model of snow plow 22 being diagnosed by the present invention, the snow removal equipment 12 is probably equipped with a plurality of diodes. The operational status of these diodes should be checked under differing circumstances depending on the particular malfunction; however, in some circumstances, the technician or service person conducting the diagnostic tests and repairs can program the diagnostic system 10 to simply check all the diodes on the snow removal equipment 12. A more experienced and knowledgeable service technician may be aware, for example, that on a particular brand of snow removal equipment 12 if the motor runs, but the left wing 21 will not extend while all other snow plow 22 functions are normal, a problem exists with the D1 or D2 diode. Running fewer diagnostic tests and procedures will save time, but the present invention increases the efficiency and productivity of a service technician who lacks the experience to pinpoint a problem based on the symptoms of the malfunction, as well as reminding the experienced service technician of likely sources of the malfunction.

An alternative embodiment of the present invention analyzes and diagnoses snow removal equipment 12 prior to a time when it is necessary for safety and other snow removal purposes. The benefits of incorporating the present invention for such purposes is that the operator is assured that his or her snow removal equipment 12 is in full working condition and that, should such a time or event occur that the snow removal equipment 12 is needed, it is ready and operational. Proactive measures such as this method of using the diagnostic system 10 of the present invention increase the dependability of snow removal businesses and the safety of travelers in hazardous travel conditions.

While a particular embodiment of the invention has been shown and described, it will be obvious to those skilled in the art that changes and modifications may be made without departing from the invention its broader aspects and, therefore, the aim in the appended claims is to cover all such changes and modifications as fall within the true spirit and scope of the invention.

We claim:

1. Apparatus for analyzing an operational condition of snow removal equipment, comprising:

a snow removal equipment diagnostic interface coupled to an analysis module for analyzing data regarding the operational condition of the snow removal equipment; and a display module coupled to the analysis module for displaying information relating to the operational condition of the snow removal equipment.

2. The apparatus as defined in claim 1 wherein the snow removal equipment diagnostic interface is removably coupled to the analysis module.

3. The apparatus as defined in claim 1 wherein the analysis module includes a personal computer and the display module comprises a video display terminal.

4. The apparatus as defined in claim 1 wherein the analysis module identifies and displays information relating to systems of the snow removal equipment and compares to a predetermined range of reference data.

5. The apparatus as defined in claim 1 wherein the display module comprises at least one indicator light.

6. The apparatus as defined in claim 1 further comprising a vehicle diagnostic interface coupled to the analysis module.

7. Apparatus for analyzing the operational condition of snow removal equipment comprising:

a snow removal equipment interface coupled to a diagnostic interface and a vehicle interface coupled to the diagnostic interface;

an analysis module coupled to the diagnostic interfaces and receiving data from the diagnostic interfaces, the analysis module including analysis hardware for analyzing data regarding the operational condition of the snow removal equipment; and a video display terminal coupled to a computer displaying information concerning the operational condition of the snow removal equipment and vehicle.

8. The apparatus as defined in claim 7 wherein the analysis module includes a storage component which can store a service history of the snow removal equipment.

9. The apparatus as defined in claim 8 wherein the analysis module can continue the service history each time the operational condition is analyzed.

10. The apparatus as defined in claim 7 wherein the apparatus for analyzing the operational condition is mobile.

11. The apparatus as defined in claim 7 wherein the apparatus can be networked with another diagnostic system.

12. The apparatus as defined in claim 7 wherein the analysis module comprises a computer interface and a computer for receiving data.

13. A method for analyzing the operational condition of snow removal equipment comprising:

coupling a diagnostic interface to snow removal equipment;

obtaining data from the diagnostic interface with an analysis module;

comparing the data with predetermined data concerning the operational condition of the snow removal equipment; and displaying information related to the data on a display module.

14. The method as defined in claim 13 wherein a computer is used to compare the data relating to the operational condition of the snow removal equipment with reference data.

15. The method as defined in claim 13 wherein the diagnostic interface is coupled to a vehicle.

\* \* \* \* \*